(12) United States Patent
Zhou et al.

(10) Patent No.: US 7,327,165 B2
(45) Date of Patent: Feb. 5, 2008

(54) DRIVE CIRCUIT OF COMPUTER SYSTEM FOR DRIVING A MODE INDICATOR

(75) Inventors: Tong Zhou, Shenzhen (CN); Jia-Hui Tu, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 90 days.

(21) Appl. No.: 11/297,893

(22) Filed: Dec. 9, 2005

(65) Prior Publication Data

US 2006/0139064 A1    Jun. 29, 2006

(30) Foreign Application Priority Data

Dec. 11, 2004  (CN) .......................... 2004 1 0077460

(51) Int. Cl.
*H03K 19/0175* (2006.01)

(52) U.S. Cl. .......................... 326/82; 326/83; 326/115; 326/126

(58) Field of Classification Search ............ 326/82–84, 326/89, 115, 124, 126–127
See application file for complete search history.

(56) References Cited

U.S. PATENT DOCUMENTS 7,030,773 B2 * 4/2006 Peterson et al. ......... 340/815.4
7,043,855 B2 * 5/2006 Heilman et al. .............. 34/389

FOREIGN PATENT DOCUMENTS

CN         03236782.1         4/2004

* cited by examiner

*Primary Examiner*—Anh Q. Tran
(74) *Attorney, Agent, or Firm*—Morris Manning Martin LLP; Tim Tingkang Xia, Esq.

(57) ABSTRACT

A drive circuit of a computer system is for driving a mode indicator. The computer system includes a first port and a second port. The mode indicator includes a first receiving end and a second receiving end. The drive circuit includes a first input end connected to the first port, a second input end connected to the second port, a first output end connected to the first receiving end, a second output end connected to the second receiving end, a power supply, a first transistor connected between the first input end and the power supply, and a second transistor connected between the second input end and the power supply. Collectors of the first and second transistors are separately connected to the first and second output ends. The mode indicator is dichromatic and has two LEDs emitting non-matching colored light.

20 Claims, 1 Drawing Sheet

DRIVE CIRCUIT OF COMPUTER SYSTEM FOR DRIVING A MODE INDICATOR

BACKGROUND OF THE INVENTION

1. Field of the Invention

The present invention relates to drive circuits of computer systems, and particularly to a drive circuit which can drive a mode indicator to show a working and a sleeping status of the computer system.

2. General Background

Conventionally, to save power sources, a sleeping mode is used in a computer system. Accordingly, an indicator is arranged in each of a PCB and a monitor, to show a working status or a sleeping status of the computer and the monitor. CN. Pat. No. 03236782.1 discloses a circuit controlled by a single chip to drive an indicator. The single chip uses a program to control the circuit. The indicator light is steadily on to show a working status. The indicator light flickers to show a sleeping status.

However, a drive circuit of the indicator must be controlled by the single chip. It is unduly complex to use the single chip because a controlling program is required. In addition, it is costly to use the single chip to control the indicator. Furthermore, the single chip not suitable for controlling more than one indicator, which may be required in some computer systems.

What is needed is a drive circuit which can overcome the above-mentioned shortcomings.

SUMMARY

A drive circuit of a computer system is for driving a mode indicator. The computer system includes a first port and a second port. The mode indicator includes a first receiving end and a second receiving end. The drive circuit includes a first input end connected to the first port, a second input end connected to the second port, a first output end connected to the first receiving end, a second output end connected to the second receiving end, a power supply, a first transistor connected between the first input end and the power supply, and a second transistor connected between the second input end and the power supply. Collectors of the first and second transistors are separately connected to the first and second output ends. The mode indicator is dichromatic and has two LEDs emitting non-matching colored light.

It is simple and economical to use the drive circuit to drive the mode indicator for showing the working status of the computer system. Furthermore, it is convenient to have more indicating space reserved, in case of functional improvement of the computer system in future.

Other advantages and novel features will become more apparent from the following detailed description when taken in conjunction with the accompanying drawings, in which:

DETAILED DESCRIPTION OF THE EMBODIMENT

Figure 1:
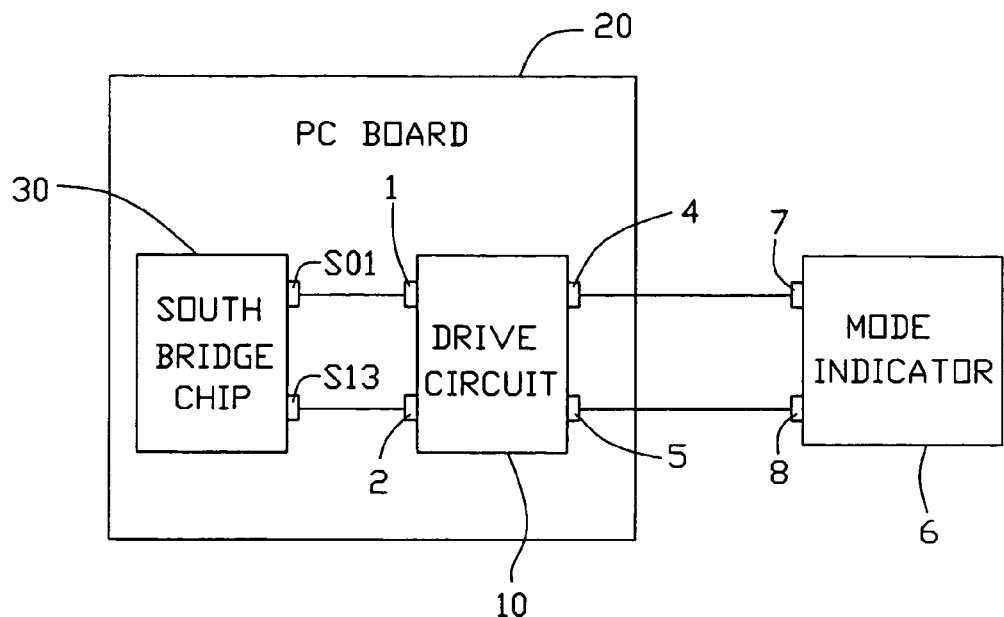
FIG. 1 is a block diagram of a drive circuit of a computer system, for driving a mode indicator in accordance with a preferred embodiment of the present invention.

Referring to FIG. 1, a drive circuit 10 in accordance with a preferred embodiment of the present invention is shown for driving a mode indicator 6 in a computer system. The computer system includes an electronic part like a PCB 20 with a south bridge chip 30 installed thereon. The south bridge chip 30 includes a first port S01 for outputting a working signal, and a second port S13 for outputting a sleeping signal. The drive circuit 10 includes a first input end 1 connected to the first port S01, a second input end 2 connected to the second port S13, a first driving end 4, and a second driving end 5. The mode indicator 6 includes a first receiving end 7 connected to the first driving end 4, and a second receiving end 8 connected to the second driving end 5.

Figure 2:
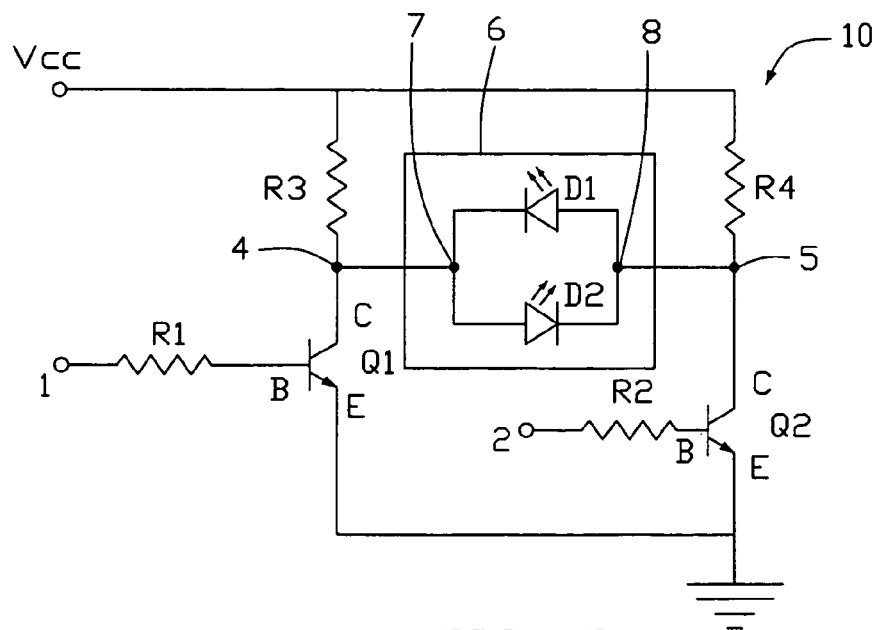
FIG. 2 is a circuit diagram of the drive circuit of FIG. 1.

Referring to FIG. 2, the drive circuit 10 includes a first transistor Q1, a second transistor Q2, a power supply Vcc, a resistor R1, a resistor R2, a resistor R3, and a resistor R4. The power supply Vcc is provided with a 5V voltage from the south bridge chip 30. The resistor R1 is connected between the first input end 1 and a base of the first transistor Q1. An emitter of the first transistor Q1 is grounded. The resistor R2 is connected between the second input end 2 and a base of the second transistor Q2. An emitter of the second transistor Q2 is grounded. The resistor R3 is connected between the power supply Vcc and a collector of the first transistor Q1. The first driving end 4 is at a node between the resistor R3 and the collector of the first transistor Q1. The resistor R4 is connected between the power supply Vcc and a collector of the second transistor Q2. The second driving end 5 is at a node between the resistor R4 and the collector of the second transistor Q2.

The mode indicator 6 is dichromatic. The mode indicator 6 includes a first LED D1, and a second LED D2 connected inversely in parallel between the first receiving end 7 and the second receiving end 8. The first LED D1 and the second LED D2 emit lights with different color. E.g., the first LED D1 emit a green light, and the second LED D2 emits an orange light.

When the PCB 20 is working, an output voltage of the first port S01 of the south bridge chip 30 is at a high level, and an output voltage of the second port S13 of the south bridge 30 is at a low level. Therefore the first transistor Q1 is turned on, and the second transistor Q2 is turned off. An electric current passes through the resistor R4, the first LED D1, and the first transistor Q1. Accordingly, the first LED D1 is powered to emit a green light at the mode indicator 6.

When the PCB is sleeping, the output voltage of the second port S13 of the south bridge chip 30 is at a high level, and the output voltage of the first port S01 of the south bridge chip 30 is at a low level. Therefore the second transistor Q2 is turned on, and the first transistor Q1 is turned off. An electric current passes through the resistor R3, the first LED D2, and the first transistor Q2. Accordingly, the second LED D2 is powered to emit an orange light at the mode indicator 6.

The drive circuit 10 also can be used to show a working status of other apparatuses in the computer system, such as a display or a monitor. The first input end 1 and the second input end 2 are separately connected to corresponding output ports of the apparatuses.

It is believed that the present embodiment and its advantages will be understood from the foregoing description, and it will be apparent that various changes may be made thereto without departing from the spirit and scope of the invention or sacrificing all of its material advantages, the example hereinbefore described merely being a preferred or exemplary embodiment of the invention.

What is claimed is:

1. A drive circuit of a computer system, the computer system comprising a PCB with a first port and a second port, the drive circuit comprising:
   a first input end adapted to connect to the first port;
   a second input end adapted to connect to the second port;
   a mode indicating unit having a first receiving end and a second receiving end, the mode indicating unit comprising a first indicator and a second indicator connected inversely in parallel between the first receiving end and the second receiving end;
   a power supply;
   a first transistor comprising a first terminal connected to the first input, and a second terminal connected to the first receiving end of the mode indicating unit and the power supply; and
   a second transistor comprising a first terminal connected to the second input, and a second terminal connected to the second receiving end of the mode indicating unit and the power supply.

2. The drive circuit as claimed in claim 1, wherein a first resistor is connected between the first input end and the first terminal of the first transistor, and a second resistor is connected between the second input end and the first terminal of the second transistor.

3. The drive circuit as claimed in claim 2, wherein a third resistor is connected between the power supply and the second terminal of the first transistor, and a fourth resistor is connected between the power supply and the second terminal of the second transistor.

4. The drive circuit as claimed in claim 3, wherein third terminals of the first transistor and the second transistor are grounded.

5. The drive circuit as claimed in claim 1, wherein first input end can receive a working signal from the first port of the PCB, and the second input end can receive a sleeping signal from the second port of the PCB.

6. The drive circuit as claimed in claim 5, wherein the power supply is adapted to receive a 5V voltage.

7. The drive circuit as claimed in claim 1, wherein the first and second output ends are able to output signals for display by the first indicator and the second indicator of the indicating unit.

8. A drive circuit of a computer system, the computer system comprising a PCB with a first port and a second port, the drive circuit comprising:
   a mode indicating unit comprising a pair of light emitting diodes connected inversely in parallel between a first receiving end and a second receiving end, an anode end of one light emitting diode connecting with a cathode end of the other light emitting diode;
   a first transistor connected between the first port of the PCB and the first receiving end of the mode indicating unit; and
   a second transistor connected between the second port of the PCB and the second receiving end of the mode indicating unit.

9. The drive circuit as claimed in claim 8, further comprising a first resistor, wherein the first transistor comprises a base and an emitter, the first resistor is for connecting the first port of the PCB and the base, and the emitter is for grounding.

10. The drive circuit as claimed in claim 9, further comprising a second resistor, wherein the first transistor further comprises a collector, the collector is for connecting to the first receiving end of the mode indicating unit, and the second resistor is for connecting between a power supply and the collector.

11. The drive circuit as claimed in claim 8, further comprising a first resistor, wherein the second transistor comprises a base and an emitter, the first resistor is for connecting between the second port of the PCB and the base, and the emitter is for grounding.

12. The drive circuit as claimed in claim 11, further comprising a second resistor, wherein the second transistor further comprises a collector, the collector is for connecting to the second receiving end of the mode indicating unit, and the second resistor is for connecting between a power supply and the collector.

13. The drive circuit as claimed in claim 8, wherein the first transistor can receive a working signal from the first port of the PCB, and the second transistor can receive a sleeping signal from the second port of the PCB.

14. The drive circuit as claimed in claim 8, further comprising a power supply adapted to receive a 5V voltage.

15. The drive circuit as claimed in claim 8, wherein the first and the second transistor can output signals for the mode indicating unit display by dichromatic.

16. A system for indicating work statuses of an electronic part, comprising:
   at least two indicators capable of presenting indications differently so as to refer said indications thereof to at least two respective work statuses of an electronic part;
   a power supply capable of powering each of at least two indicators so as to support indication presentation of said each of said at least two indicators; and
   at least two switches electrically connectable to said power supply and said at least two indicators, said at least two indicators connected inversely in parallel between said at least two switches, an anode of one of said at least two indicators connected to a cathode of the other one of said at least two indicators, each of said plurality of switches corresponding to said each of said at least two indicators, said each of said plurality of switches capable of accepting a control signal from said electronic part so as to control said powering of said corresponding each of said at least two indicators based on said control signal.

17. The system as claimed in claim 16, wherein said each of said at least two switches is a transistor.

18. The system as claimed in claim 16, wherein said at least two indicators are integrally formed in a dichromatic indicator.

19. The drive circuit as claimed in claim 1, wherein the first receiving end of the indicating units is connected to an anode of the first indicator and a cathode of the second indicator, the second receiving end of the indicating units is connected to an anode of the second indicator and a cathode of the first indicator.

20. The system as claimed in claim 16, wherein a first terminal of said each of said at least two switches is electrically connectable with a port of said electronic part to accept said control signal, and a second terminal of said each of said at least two switches is electrically connectable with said power supply and said at least two indicators in series.

* * * * *